United States Patent [19]
Pace

[11] Patent Number: 6,137,169
[45] Date of Patent: Oct. 24, 2000

[54] HEAT REDUCTION SYSTEM FOR TRANSISTOR ASSEMBLIES

[76] Inventor: Adolfo Pace, Via Ospedale Nuovo, 1/TER, 36071 Arzignano (VI), Italy

[21] Appl. No.: 09/025,790

[22] Filed: Feb. 19, 1998

[30] Foreign Application Priority Data

Oct. 7, 1997 [IT] Italy .................................. VI97A00107

[51] Int. Cl.⁷ .......................... C23C 14/34; H01L 25/04; H01L 23/02; H01L 39/02
[52] U.S. Cl. ........................ 257/706; 257/714; 257/715; 257/716; 257/699; 257/723
[58] Field of Search .................... 257/706, 714, 257/715, 716, 723, 730, 712, 699

[56] References Cited

U.S. PATENT DOCUMENTS

| | | |
|---|---|---|
| 3,971,435 | 7/1976 | Peck . |
| 4,081,313 | 3/1978 | McNeilly et al. .......................... 2/416 |
| 4,341,592 | 7/1982 | Shortes et al. ................................ 134/2 |
| 4,410,792 | 10/1983 | Komura et al. .......................... 219/383 |
| 4,496,609 | 1/1985 | McNeilly et al. . |
| 4,588,023 | 5/1986 | Munekawa .......................... 165/104.33 |
| 4,838,983 | 6/1989 | Schumaker et al. ...................... 117/89 |
| 4,873,613 | 10/1989 | Iversen . |
| 4,944,860 | 7/1990 | Bramhall, Jr. et al. ............. 204/298.23 |
| 5,019,233 | 5/1991 | Blake et al. . |
| 5,263,251 | 11/1993 | Matthews .......................... 29/890.036 |
| 5,271,455 | 12/1993 | Semple .................................. 165/80.4 |
| 5,289,342 | 2/1994 | Spalding et al. ........................ 361/699 |
| 5,291,064 | 3/1994 | Kurokawa ................................ 257/714 |
| 5,349,498 | 9/1994 | Tanzer et al. . |
| 5,436,501 | 7/1995 | Ikeda ....................................... 257/714 |
| 5,448,108 | 9/1995 | Quon et al. ............................. 257/714 |
| 5,504,378 | 4/1996 | Lindberg et al. . |
| 5,539,254 | 7/1996 | Eytcheson et al. ..................... 257/691 |
| 5,640,995 | 6/1997 | Packard et al. ........................ 137/597 |

FOREIGN PATENT DOCUMENTS

| | | |
|---|---|---|
| 0 047 099 A2 | 3/1982 | European Pat. Off. . |
| 0 603 860 A2 | 6/1994 | European Pat. Off. . |
| 2 126 802 | 3/1984 | United Kingdom . |

*Primary Examiner*—Alexander O. Williams
*Attorney, Agent, or Firm*—Dykema Gossett PLLC

[57] ABSTRACT

A power module or other circuit is formed with transistor assemblies, each having one or more semiconductor slices electrically connected to one another and fixed to a supporting system. The supporting system includes a tubular element suited to allow the flood of a refrigerating and insulating fluid in the inside and which has the semiconductor slices directly welded on its external surface.

21 Claims, 8 Drawing Sheets

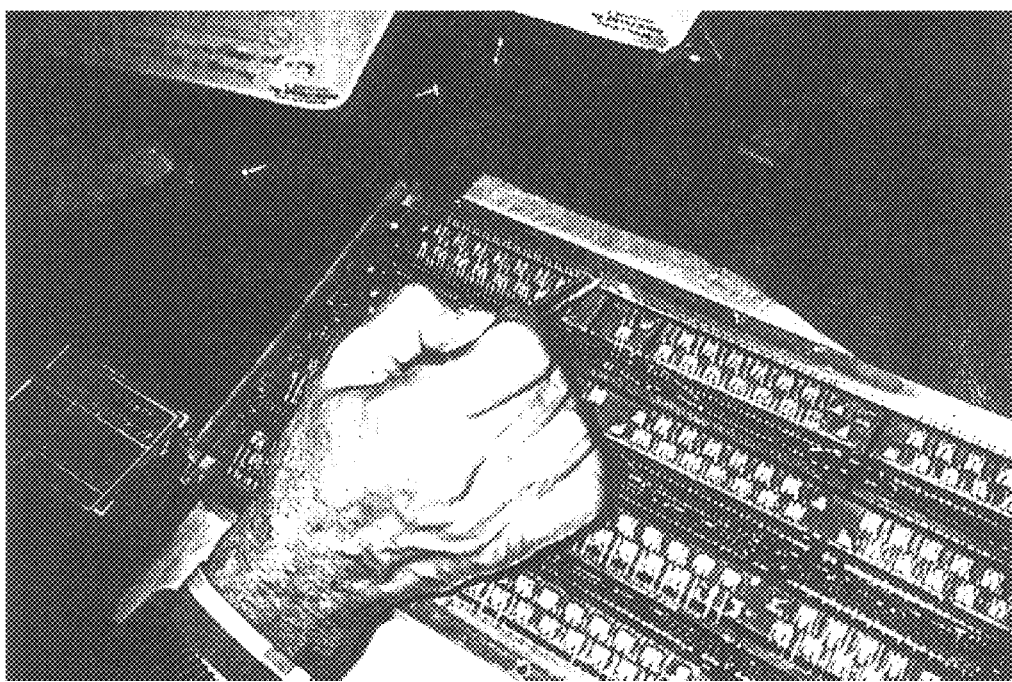
FIG. 14
FIG. 15
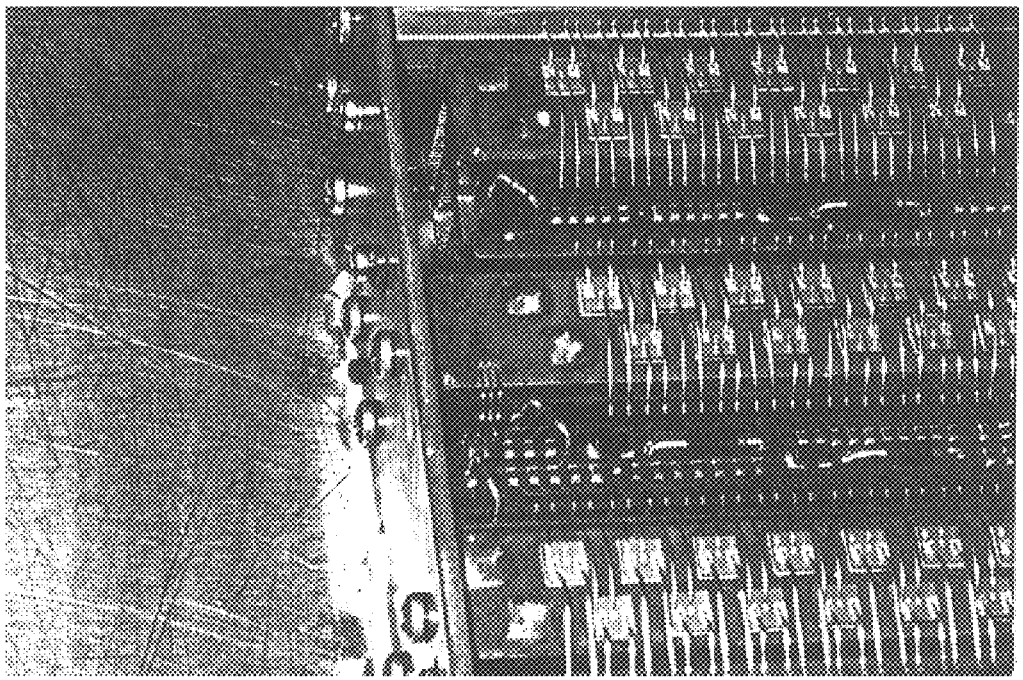

HEAT REDUCTION SYSTEM FOR TRANSISTOR ASSEMBLIES

BACKGROUND OF THE INVENTION

1. Field of the Invention

The invention concerns a semiconductor power module with an insulating fluid (e.g., liquid) cooling system.

2. General State of the Art

Semiconductor power modules can be used as inverters or other activation devices. Modules of this type can include a plurality of parallel-connected semiconductor devices such as transistors T, MOSFET or IGBT devices of the type schematically illustrated in FIG. 1 and shown in greater detail in FIGS. 2 and 3. A plurality of such devices are formed on a chip (silicon element) F. A copper slice A carries an insulating thin layer of alumina D which in turn carries a copper galvanic deposit G. One or more chips F are welded on the copper galvanic deposit G. The lower surface of the copper slice A is connected to a radiator or heat sink H cooled by water or air circulation. The upper side of the copper slice A, carrying the insulating alumina layer D and the chips F, is immersed in a silicone resin I for protecting the chips F from environmental damage from air, water, dust, and the like.

As shown schematically in FIG. 1, each chip F has one or more transistors T formed thereon, each transistor T having an emitter E, a base B, and a collector C. Wires are connected to corresponding contacts to allow connection with other transistors in the module.

It is inconvenient to employ several transistors of the type described above for power modules because the materials used, particularly the copper slice A, the insulating alumina layer D, the copper layer G and the silicon elements F, have different coefficients of thermal expansion. As a result, thermal cycling during operation breaks the welds and thus causes the transistors and the whole module to which they are secured to fail. The welded contact between the copper deposit G and external connection terminals are especially prone to such breakage.

Moreover, the insulating alumina layer D has a poor coefficient of heat transmission and thus reduces the heat exchange between the chips F and the radiator or heat sink H, thereby reducing the heat dissipation during operation of the module. Above a certain power, this reduction in the heat dissipation leads to a phenomenon called "heat leak," in which the dispersed power increases without suitable heat dissipation. Heat leak is especially a problem with field-effect transistors, whose coefficients of thermal expansion increase with temperature. In addition, the silicone resin is an insulator which forms a thermal barrier, further limiting heat dissipation.

SUMMARY OF THE INVENTION

The present invention proposes to overcome the problems described above.

In particular, it is an object of the invention to produce a power module which uses transistors with fewer welds than in known modules.

It is another object to obtain a power module that has a coefficient of heat disposal greater than the equivalent power modules of the known technique.

It is another object to use fewer chips than in known modules operating at the same power.

It is another object to make the module airtight and thus better protected against the elements.

These and other objects can be achieved with the power module of the invention using a plurality of electrically connected transistors. Each of the transistors includes one or more electrically connected silicon slices fixed to a supporting system. The supporting system comprises a tubular element for carrying a flow of a refrigerating fluid, thus facilitating heat dissipation. The tubular element has an external surface to which the silicon slices are directly welded.

According to one illustrative embodiment, the tubular element has a substantially prismatic cross-sectional shape so that all the modules which contain transistors are grouped near one other, with an interposed insulating layer, in order to form a parallelepiped block.

Ends of the tubular elements are formed with suitable manifold-like covered fluid transitions. A pump circulates an insulating cooling liquid in the tubular elements in a tortuous or twisting path. The liquid is conveyed to a suitable external refrigeration system to be cooled to increase the heat exchange of the power module with the environment and to lower the operating temperature.

The tubular elements are stacked to form a parallelepiped block. A lid is attached to the block, and the lid is fitted to a container which contains insulating oil for immersing the block. The lid and the container form an airtight seal therebetween.

Advantageously, a power module according to the invention has a higher power capability than known modules having the same external dimensions. Alternatively, a power module with the same power has overall dimensions smaller than those of the known modules.

The resulting power module is completely isolated against the environment and is both flameproof and more reliable.

BRIEF DESCRIPTION OF THE DRAWINGS

An illustrative embodiment of the invention will be set forth in detail with reference to the drawings, in which:

FIGS. 12–15 are photocopies of photographs of components of the block of FIG. 7 in various stages of assembly.

DETAILED DESCRIPTION OF THE INVENTION

Figure 10:
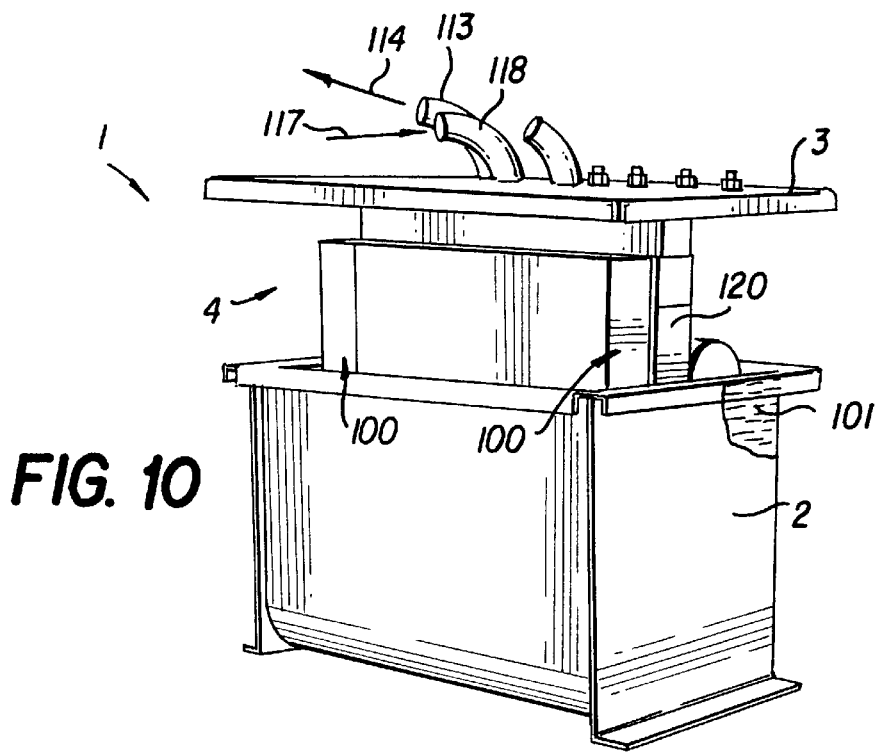
FIG. 10 is a perspective view of the lid arrangement of FIG. 9 with the block being immersed in a tank which contains insulating oil.
Figure 11:
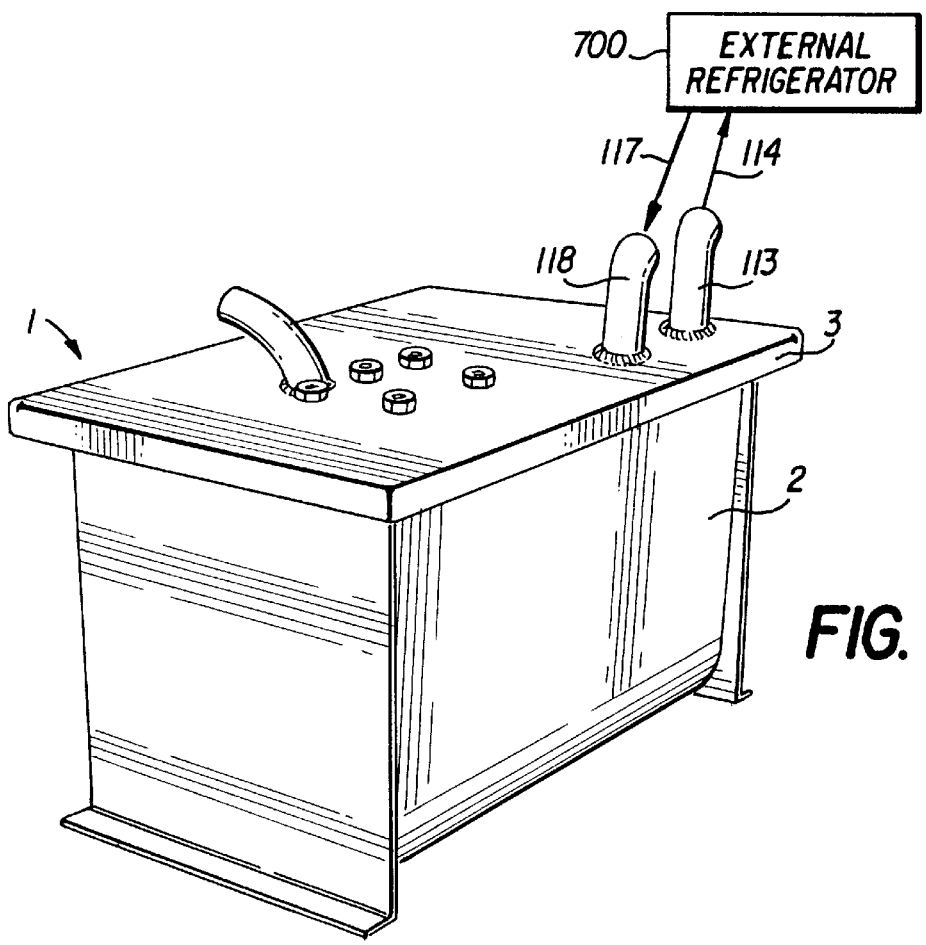
FIG. 11 is a perspective view of the arrangement of FIG. 9 as an assembled power module, after immersion of the block in the tank.

A semiconductor power module 1 of the invention is shown in FIGS. 10 and 11, respectively in open and closed positions. As shown in FIGS. 10 and 11, the power module 1 comprises a metallic container 2 which is closed by a lid 3 carrying a parallelepiped block 4. The block 4 includes multiple transistor assemblies such as transistor assembly 10 shown in FIG. 4.

The transistor assembly 10 carries a plurality of semiconductor devices 9, each comprising a silicon slice 11. The semiconductor devices 9 are welded to a supporting system comprising a tubular metallic element 12, having a high electrical and thermal conductivity. The slice 11 is secured to a front face 19 of the element 12. A power terminal 212 is mechanically fixed to the element 12 as shown. Examples of suitable materials for forming the tubular metallic element 12 are copper and aluminum. A prismatic metallic bar 18 is mechanically connected to the bottom of the tubular metallic element 12. A power terminal 218 is mechanically fixed to the metallic bar 18.

The tubular element 12 and the prismatic bar 18 are electrically insulated from each other by a layer of insulating material 55. Examples of suitable materials for forming the layer 55 are plastic fibers and finespun glass material such as that sold under the trademark FIBERGLAS. The tubular element 12 has a prismatic profile and has interior ducts 14 for carrying an insulating refrigerating liquid.

The block 4 has a recess 91 formed in the front face 19. The recess 91 has opposite channels 92 for receiving a printed circuit board as hereinafter described.

Each of the silicon slices 11 has a central contact B corresponding to the transistor base and a pair of lateral contacts E, each corresponding to the emitter of the transistor. The tubular element 12 has a contact C corresponding to the collector of the transistor. Conductors 15 connect the base B of each transistor 9 to the control of a printed circuit belonging to a connecting card 90 shown in FIG. 7. One or more conductors 16 connect the collector and tubular element 12 to the prismatic metallic bar 18. Conductors 17 connect the emitters E to the bar 18.

Figure 4:
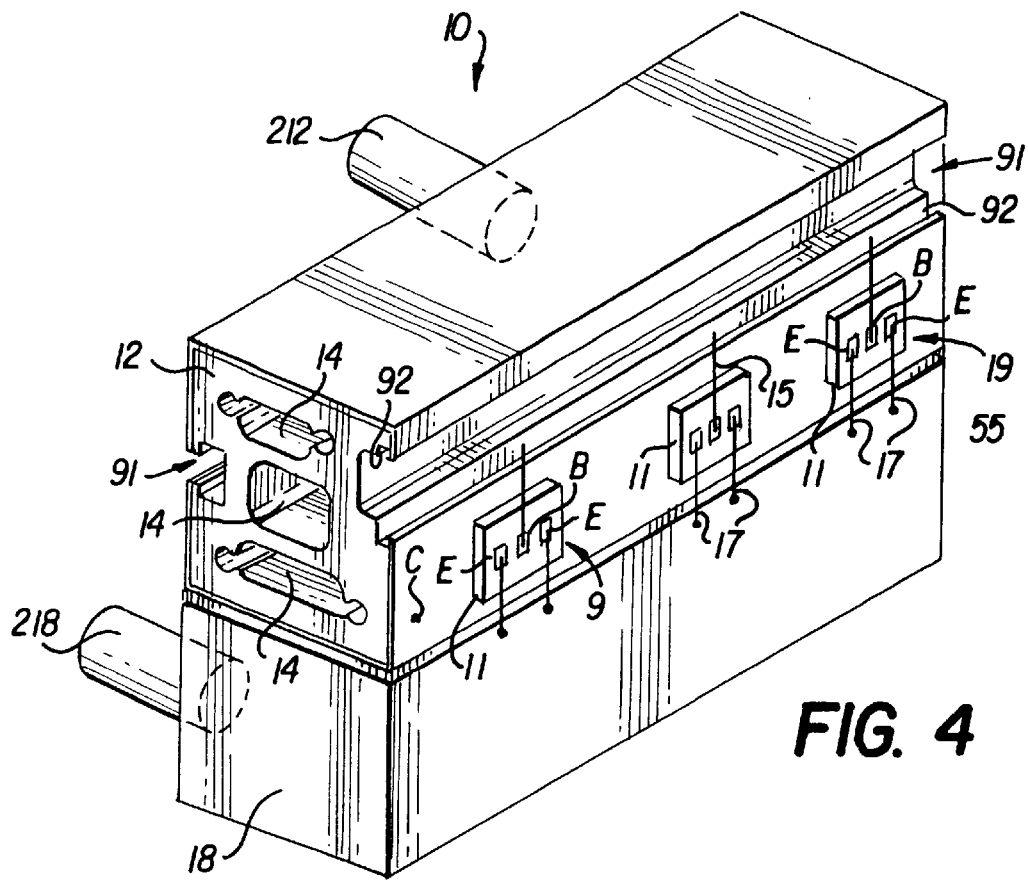
FIG. 4 is a perspective view of a transistor assembly forming a portion of the power module of the invention.

According to the arrangement, the tubular element 12 provides both mechanical support for the silicon slices 11 and an electrical connection as part of the collector. If the arrangement shown in FIG. 4 is analogized to the prior art of FIG. 2, it will be readily apparent that the silicon slice 11 corresponds to the chip F, while the tubular element 12 corresponds to both the copper slice A in terms of mechanical support and the galvanic deposit G in terms of electrical connection. Thus, in accordance with the invention, the alumina layer D can be dispensed with. Further, any transistor or other semiconductor device could be formed in either arrangement by appropriate doping or other alteration of the silicon slice 11.

Figure 1:
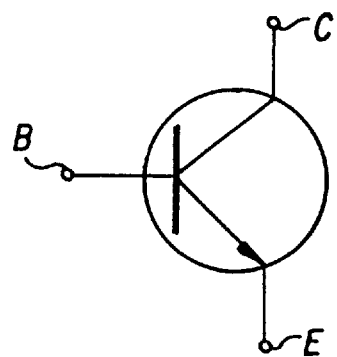
FIG. 1 is a schematic representation of a known transistor.
Figure 2:
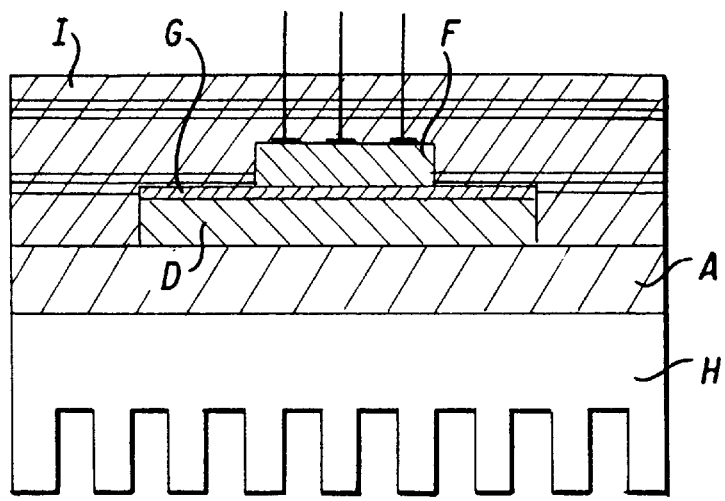
FIGS. 2 and 3 are cross-sectional and perspective views, respectively, of an arrangement of transistors used in known power modules.
Figure 3:
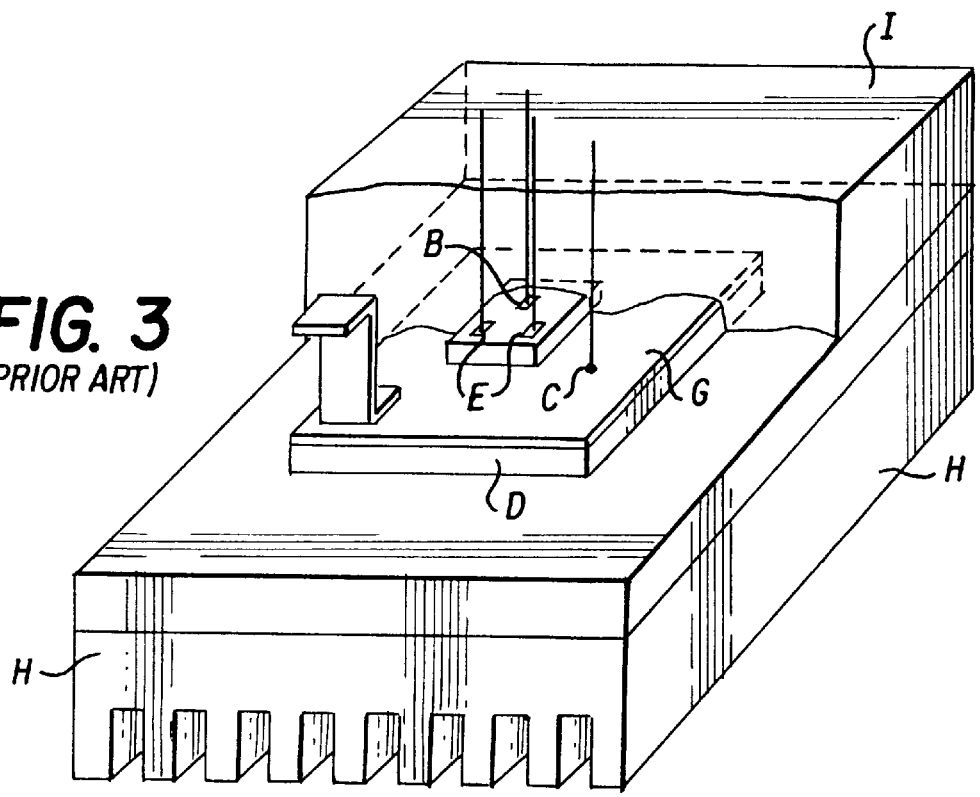

According to the invention, each silicon slice 11 is welded directly by a soft solder (e.g., an alloy composition of tin, lead, silver) on the tubular element 12, without the interposition of an alumina slice such as slice D of FIGS. 2 and 3. The resulting thermal exchange is much higher than that in the known arrangements.

As described hereinafter, an insulating refrigerating fluid circulates inside the ducts 14 of the tubular element 12, and the block 4 is immersed in the same refrigerating liquid, whereby heat dispersion is improved.

Multiple transistor assemblies 10 can be appropriately connected to each other and secured to the tubular elements 12 to assemble an inverter. See for example the arrangement of interconnected members 30, 40, 50, 60, 70 forming block 4 as shown in FIGS. 6–9 and a corresponding schematic electrical circuit illustrated in FIG. 5. Such a block 4 includes a centrally located first tubular metallic element 30 having areas 31 and 32, each carrying one or more plurality silicon slices 130 similar to silicon slice 11 shown in FIG. 4 and described above. Silicon slices 130 form the transistors 131, 231 and 331 represented in the diagram of FIG. 5. Member 30 has a printed circuit card receiving recess 91 formed with opposed channels 92 as shown.

Equal silicon slices 130 are present in areas 41, 42, 43 and form the transistors 141, 241 and 341 respectively. In such a way all transistors 130 present in the areas 31, 41, 42, 43 form the inverter represented in FIG. 5.

The same type of inverter may be realized with slices 130 operating as transistors present in the area 32 and in the areas 51, 52, 53. Thus, the slices 130 in the area 32 form the transistors 131, 231 and 331 represented in FIG. 5. The slices 130 in the areas 51, 52 and 53 form the transistors 141, 241, 341.

Therefore in the block 4 there are two different inverters, the first one formed by the slices 130 present in the metallic elements 30 and 40 and by the metallic bar 60 connected to the negative pole 80; the second one formed by the slices 130 present in the metallic elements 30 and 50 and by the metallic bar 70 which must also be electrically connected to the negative pole 80. The two inverters can work separately or together.

One example of a simultaneous use of two inverters can be found in powering of two electric motors in an electric truck, one motor powering the lifting pump, the second motor powering the traction of the truck. In other applications, the block 4 may not require members 40 and 50.

In addition to the various tubular metallic elements 30, 40, 50, the block 4 includes two outer prismatic metallic bars 60 and 70 which are fixed to the members 40 and 50 and which work as negative poles. The metallic members 30, 40, 50, 60 and 70 are suitably insulated from each other by layers of electrical insulation 55 which acts as an insulation. Such material may be a co-impacted plastic fiber and finespun glass material such as FIBERGLAS®.

Figure 5:
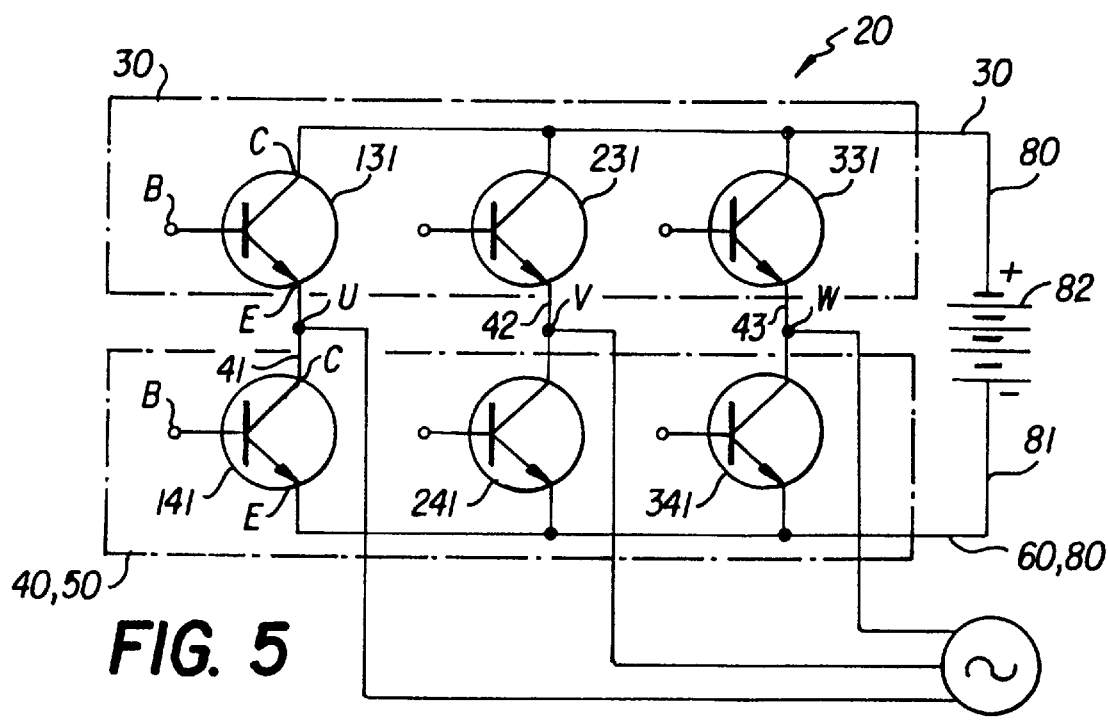
FIG. 5 is a schematic diagram of an inverter implemented by the power module of the invention.

The circuit of FIG. 5 is implemented in the following manner. A generator or D.C. source 82 is connected between elements 30 and 60. A positive side 81 of the generator 82 is connected to the surface 631 of the area 31 of the first tubular element 30, and the negative side 80 of a generator 82 is connected to the surface 661 of the prismatic bar 60.

Figure 6:
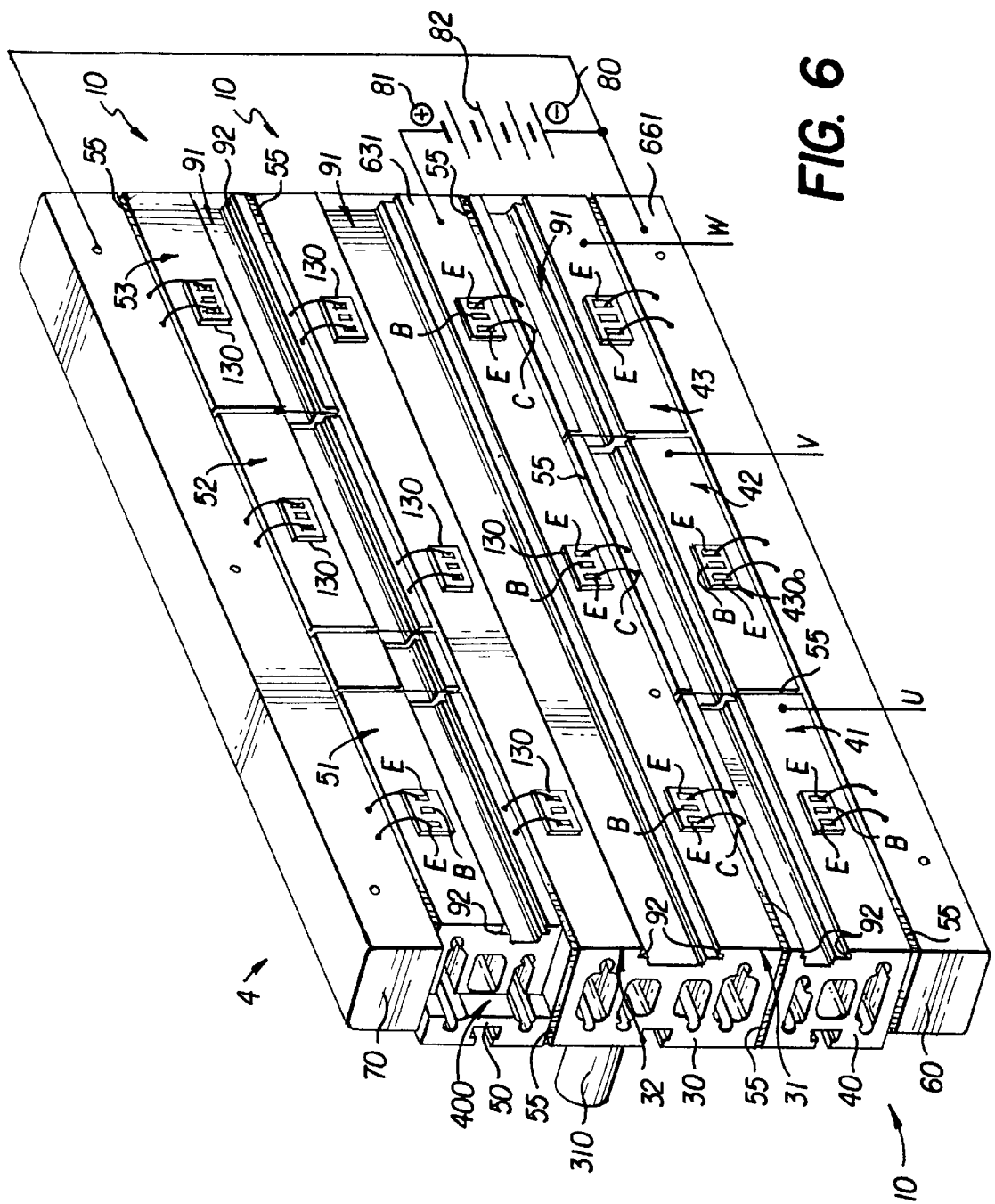
FIG. 6 is a perspective view of a portion of the power module of the invention which forms a parallelepiped block.

According to the diagram in FIG. 5, it can be seen from FIG. 6 that each emitter E of each slice 130 of area 31 is connected to each collector C of each slice 130 in the areas 41, 42 and 43, respectively.

Each of these connections is one phase of the three-phase alternating source U, V and W (see FIG. 5). Output signals U, V, W are taken respectively from the first area 41, from the second area 42 and from the third area 43 formed on the triad 40. As shown, the output signals represent an alternating source.

The various tubular elements and prismatic bars each have a different electrical potential because of the various potential drops between the positive side 81 and the negative side 80 of the generator 82. Accordingly, the various elements and bars are insulated from one another by insulating layers 55.

Figure 7:
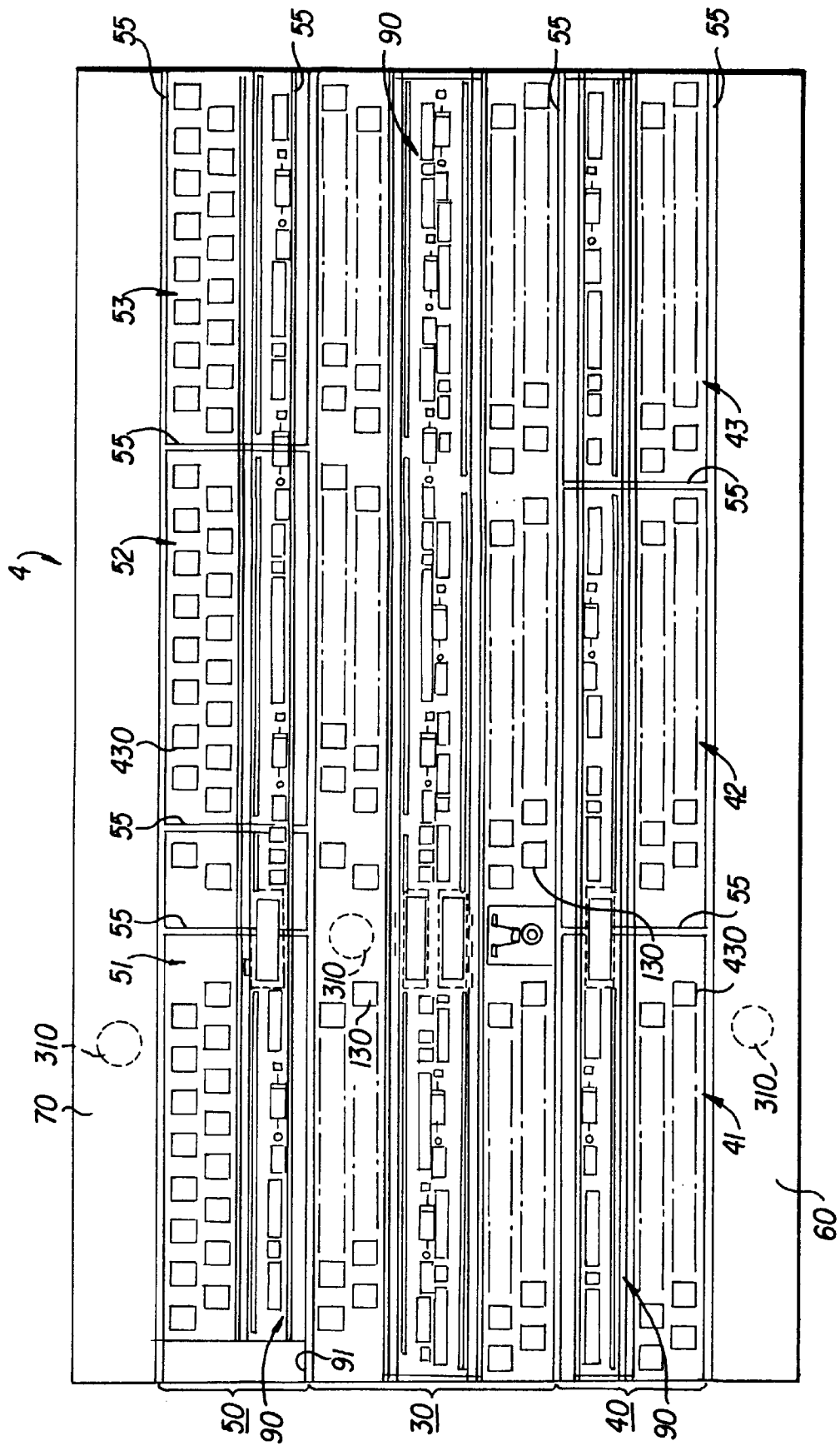
FIG. 7 is a front elevation of the portion of the module shown in FIG. 6 as well as a schematic view of the layout of the transistors in such portion of the module.

Power terminals 310 are mechanically secured (e.g., threaded or interference fit) to the back of the tubular elements and the bars, as shown in FIGS. 6 and 7. The power terminals 310 are mechanically fixed to the elements which form the parallelepiped block 4. In the exemplary embodiment illustrated the power terminals 310 are not welded to the block 4 as in the prior art. As a result, the damaging effects in known devices caused by differential expansion of the welded areas during thermal cycling, is avoided at the junctures between the power terminals 310 and the block 4, and reliability is thereby increased.

Further, connections and electrical controls are provided by means of connecting cards 90 shown in FIG. 7. The connecting cards are sized to be slidably inserted in the recess 91 between the opposed corresponding channels 92 in the tubular elements referred to hereinabove. Suitable connections are made between the slices and devices on the cards as shown.

The invention avoids welds, because welding materials often have a coefficient of thermal expansion different from the parts to be joined. Accordingly, with so many components mechanically fixed together, differential expansion between joined parts is virtually eliminated.

Figure 8:
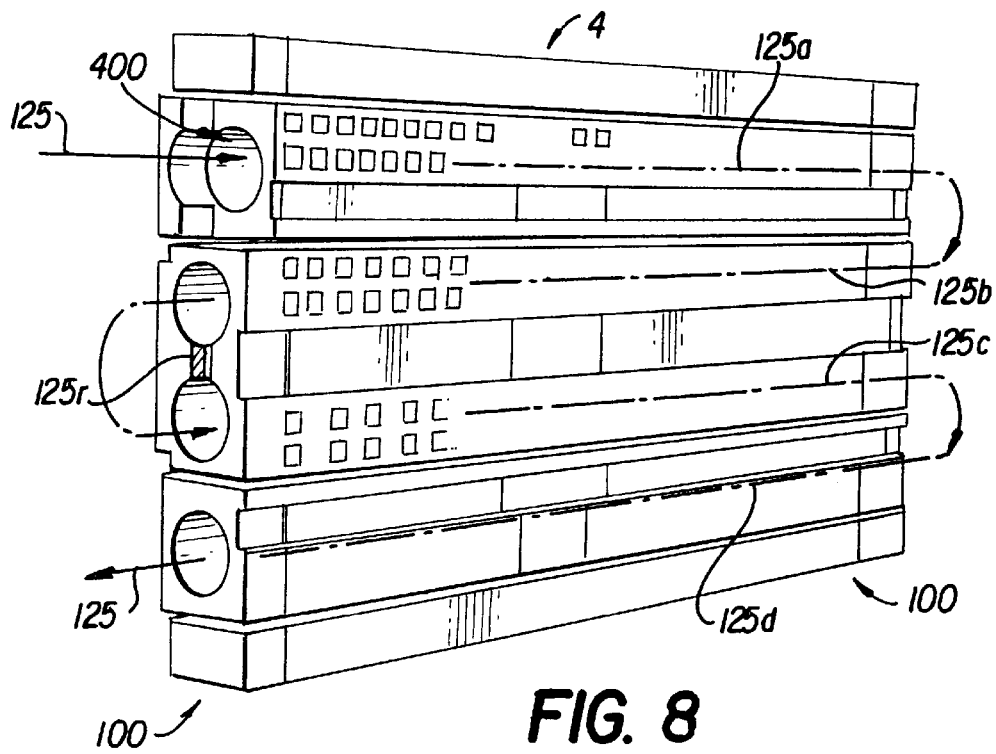
FIG. 8 is a perspective view of the module of FIG. 6 in the form of a parallelepiped block provided with tubular elements and headers for circulation of refrigerating liquid.
Figure 9:
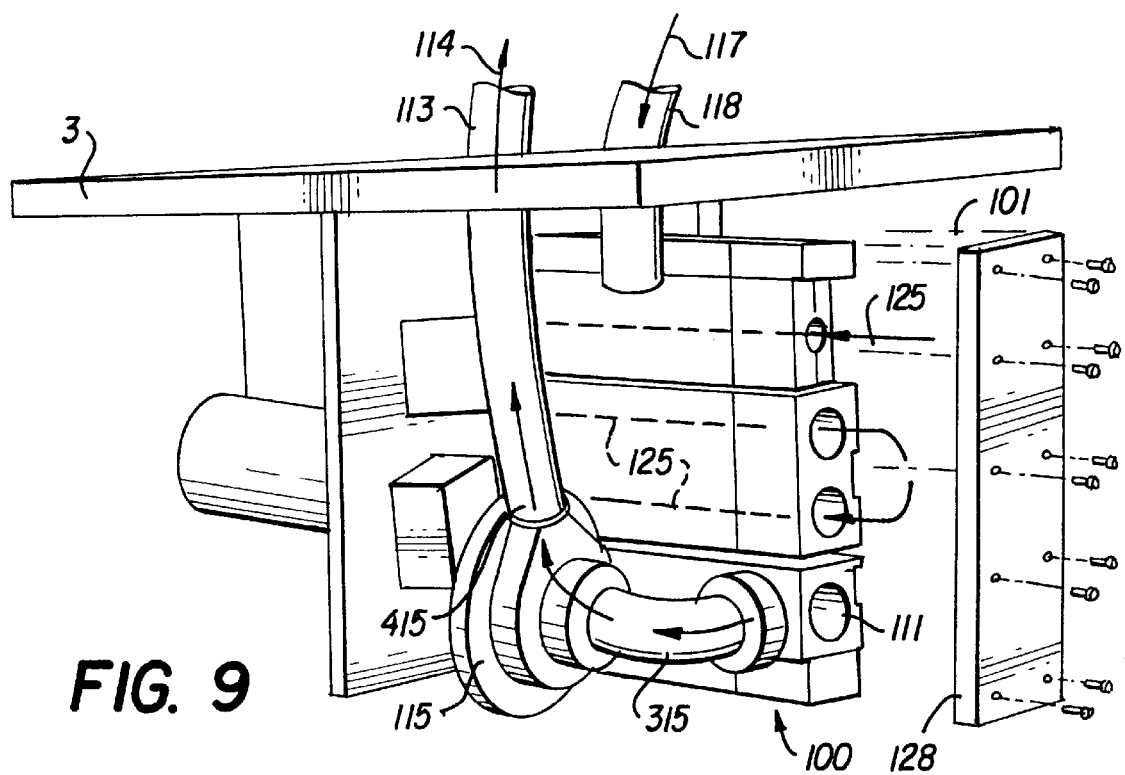
FIG. 9 is a perspective view of the module of FIG. 8 secured to the lid of a container and connected to a pump for circulation of the insulating refrigerating liquid inside the tubular elements.

Supporting end covers 120 formed of an insulating material such as FIBERGLAS® or the like in a resinous matrix are secured to the ends of the metallic tubular elements 30–50 by screws as shown in FIG. 9, to thereby assemble the Block 4 into a uniform structure with the various metallic parts electrically insulated. After the block 4 is assembled, a lid 3 is attached, as shown in FIG. 9. A header 100, which communicates with the ducts 14 of each of the tubular elements 12, is fixed to each side of the block 4, as shown in FIG. 8. Inlets 111 of each header 100 are closed by the end covers 120. One header 100 has a recessed portion 400 which thus provised by the end covers 120, thus providing an inlet in communication between the ducts 14 and an area outside the block 4. Alternatively, the headers 100 can be dispensed with, and the end covers 120 can be attached directly to the tubular elements 12.

Figure 12:
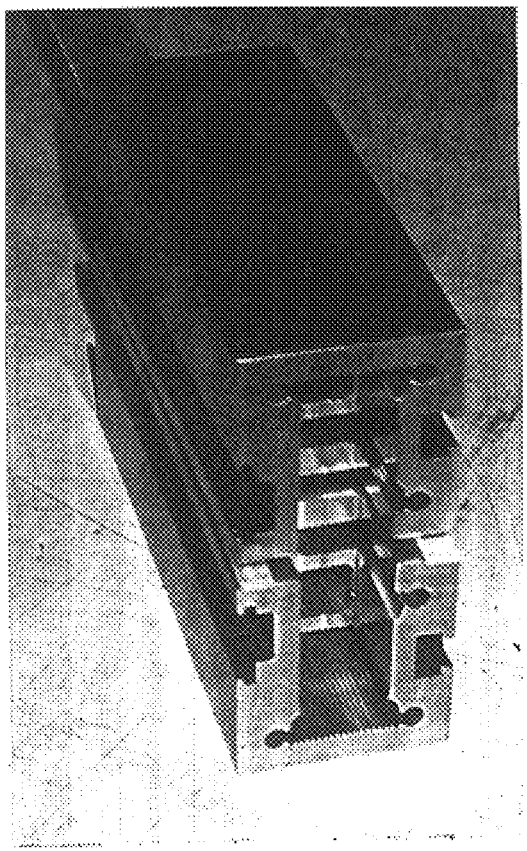
Figure 13:
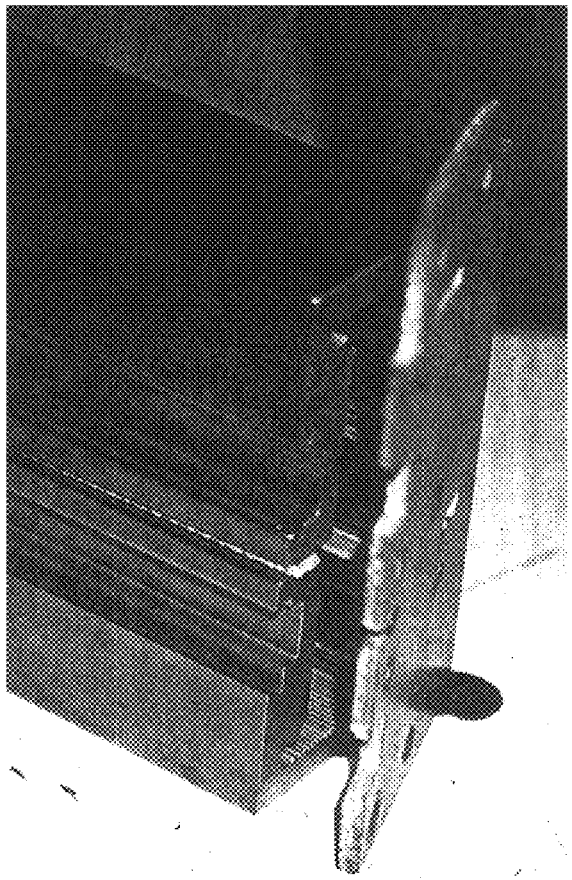

As illustrated in FIGS. 12 and 13, ends 332 of the prismatic block 30 may be formed with a recess 125r in which portions of the walls forming ducts 14 are removed. The recess 125r allows flow communication between the ducts as shown. The lid 120 may be provided to close the recess 125r, thus providing a closed path.

The parallelepiped block 4 is inserted into the container 2, which may be filled with insulating and refrigerating oil 101, as shown in FIG. 10. The recessed portion 400 provides an inlet for the oil into the ducts 14 from the interior of the container 2.

A pump 115 includes a sucker inlet 315, connected to an outlet in one of the heads 100, in flow communication with the inlet 400 via ducts 14. The pump 115 has an outlet 415 connected to a delivery pipe 113 passing through a sealed opening in the lid 3. The pump 115 sucks the insulating and refrigerating oil through the inlet recess 400. The oil is thus forced to pass through the parallelepiped block 4 from the inlet 400 to the sucker inlet 315 along flow path 125 generally represented in FIG. 8 to reach the delivery piping 113 which conveys the fluid in the direction 114 to and through an external refrigerator 700. The oil returns to the container 2 in the direction 117 from the refrigerator 700 via the return piping 118 passing through a sealed opening in the lid 3. The circulating pump 115 produces forced circulation through and around the block 4 which optimizes thermal exchange and dissipates more heat than in known systems.

As shown in FIG. 8, the flow path 125 includes components 125a 125b, 125c, and 125d through the various internal ducts. As noted, the recess 125r facilitates connection between paths 125b and 125c. Similar recesses can be provided between paths 125a and 125b and between paths 125c and 125d.

FIGS. 12–15 are color photographs of various components of the arrangement shown in FIG. 7 in various stages of assembly. FIG. 12 shows two tubular elements (such as elements 30 and 50) with insulating element 55 therebetween. FIG. 13 shows the tubular elements with lid 120 opened to reveal the recess 125r. FIGS. 14 and 15 show two views of the block 4 of FIG. 7. FIGS. 14 and 15 also show the cards 90 in the corresponding channels 92.

In the exemplary embodiment, in use, the block 4 is fully immersed in the liquid 101 contained in the container 2. Accordingly, the power module of the invention is flameproof and insulated from the environment. The power module is thus protected from humidity, dust, chemical agents and other dangers and thereby exhibits increased reliability.

According to another feature of the invention, the distances between the transistors are reduced, thus reducing resistivity and the accompanying waste of power.

According to another feature of the invention, a power module is provided with transistors having fewer welding points than in the prior art.

Also, a larger coefficient of thermal exchange is possible because the silicon slices 11 are welded directly to the tubular element 12 rather than being attached through an alumina or other insulating layer.

In addition, because the tubular elements are immersed in the refrigerating insulating liquid which fills the container, the refrigerating insulating liquid circulates both inside the container and inside the parallelepiped block. As a result, more heat dissipation can be achieved and greater power output can be produced with fewer chips in comparison with known arrangements.

While illustrative embodiments have been set forth in detail, those skilled in the art will appreciate that various modifications can be made without departing from the invention. For example, a different number of transistors can be provided, or the tubular elements can have different shapes. Also, the listing of materials is illustrative rather than limiting. Any modifications disclosed separately can be combined. The power module of the invention can realized in many forms and can be assembled to supply any desired power output. Circuits other than power modules can be realized without departing from the invention.

I claim:

1. A circuit comprising:
   at least one transistor assembly having at least one semiconductor slice having electrical connections for the circuit;
   a supporting system for supporting the at least one semiconductor slice and for removing heat produced during operation of the circuit, said supporting system including a tubular element having an external surface and an internal duct for carrying a flow of an insulating refrigerating fluid; and
   said at least one semiconductor slice being welded directly to and in electrical contact with the supporting surface.

2. A circuit according to claim 1, wherein the at least one semiconductor slice is welded directly on the external surface of the tubular element.

3. A circuit according to claim 1, further comprising a plurality of said at least one transistor assemblies wherein said a plurality of transistor assemblies are arranged with their supporting systems mechanically connected such that the semiconductor slices and the tubular elements of the transistor assemblies are arranged in a parallelepiped block comprising:

at least one first tubular element on which a plurality of said semiconductor slices are fixed;

a plurality of second tubular elements on which a plurality of said semiconductor slices are fixed, said second tubular elements being disposed along an axis parallel to said first tubular element;

at least one prismatic bar disposed parallel to and fixed to said plurality of said second tubular elements; and insulating means mechanically connecting the at least one first tubular element, the plurality of second tubular elements and the at least one prismatic bar.

4. The circuit of claim 3, wherein, in each of the transistor assemblies, the tubular element forms a collector, and the at least one semiconductor slice comprises at least a first contact which forms an emitter and at least a second contact which forms a base.

5. A circuit according to claim 3, wherein said prismatic block further comprises:

a plurality of third tubular elements disposed along an axis parallel to the at least one first tubular element and on an opposite side said at least one first tubular element from the plurality of second tubular elements such that the plurality of third tubular elements are connected to the at least one first tubular element by said insulating means; and a second prismatic bar disposed parallel to and fixed to the plurality of third tubular elements by said insulating means.

6. A circuit according to claim 5, further comprising a power supply having positive and negative sides for supplying direct current to the circuit, and wherein:

each emitter of the first plurality of semiconductor slices is electrically connected to the external surface of one of the second plurality of tubular elements;

each emitter of the second plurality of semiconductor slices is electrically connected to said at least one prismatic bar;

said at least one first tubular element is electrically connected to the positive side of said power supply; and said at least one prismatic bar is electrically connected to the negative side of said power supply.

7. A circuit according to claim 3, further including a card for electrical connection with each of said plurality of transistor assemblies, and wherein said tubular element of each of said plurality of transistor assemblies has a longitudinal slot for receiving the card.

8. A circuit according to claim 3, further comprising means for maintaining the tubular elements of the plurality of transistor assemblies at different potentials.

9. A circuit according to claim 3, further comprising:

means disposed at ends of the prismatic block for interconnecting the ducts of the tubular elements; and a pump coupled to the block for circulating the insulating refrigerating fluid through the ducts.

10. A circuit according to claim 9, further comprising:

a container for receiving the block and the insulating and refrigerating fluid; and a lid fixed to the prismatic block for sealably engaging the container.

11. A circuit according to claim 10, wherein said pump comprises a sucker connected to one of the heads, and further comprising:

refrigerator for cooling the fluid external of the container;

a delivery pipe for conveying the fluid from the container to the external refrigerator; and a return pipe for conveying the fluid from the refrigerator to the container.

12. A circuit according to claim 1, wherein each of the semiconductor slices of the plurality of transistor assemblies comprises silicon.

13. A circuit according to claim 1, including at least one inverter.

14. A circuit according to claim 3, including insulating means for connecting the first and second tubular elements together.

15. A circuit according to claim 14, wherein the insulating means comprises insulating end covers for the tubular elements.

16. A circuit according to claim 15, further including a layer of insulation between the tubular elements.

17. A transistor assembly comprising:

at least one semiconductor slice having electrical connections;

a supporting system for supporting the at least one semiconductor slice and for removing heat produced during operation of the transistor assembly, wherein said supporting system comprises a tubular element having an external surface and an internal duct for carrying a flow of an insulating refrigerating fluid; and said at least one semiconductor slice being welded directly to and in electrical contact with the supporting surface.

18. A transistor assembly according to claim 17, wherein the at least one semiconductor slice comprises silicon.

19. A transistor assembly according to claim 17, wherein the at least one semiconductor slice is welded directly on the external surface of the tubular element.

20. A circuit of claim 17, including a plurality of said slices being connected as an inverter.

21. A transistor assembly comprising:

at least one semiconductor slice comprising a first contact acting as a base and a second contact acting as an emitter;

a metal body, having a plurality of ducts for carrying an insulating, refrigerating liquid and a metal surface to which the at least one semiconductor slice is directly welded to and is in electrical contact with, said metal body used for removing heat produced during operation of the transistor assembly and for acting as a collector.

* * * * *

UNITED STATES PATENT AND TRADEMARK OFFICE
CERTIFICATE OF CORRECTION

PATENT NO. : 6,137,169

DATED : October 24, 2000

INVENTOR(S) : Adolfo Pace

It is certified that error appears in the above-identified patent and that said Letters Patent is hereby corrected as shown below:

On the Title Page, Item [30] Foreign Application Priority Data should read:
------ July 10, 1997   [IT]   Italy......................V197A000107 --------

Signed and Sealed this

Twenty-ninth Day of May, 2001

*Attest:*

NICHOLAS P. GODICI

*Attesting Officer*     *Acting Director of the United States Patent and Trademark Office*